United States Patent
Yu et al.

(10) Patent No.: US 6,258,713 B1
(45) Date of Patent: Jul. 10, 2001

(54) METHOD FOR FORMING DUAL DAMASCENE STRUCTURE

(75) Inventors: Chia-Chieh Yu, Taipei Hsien; Yueh-Feng Ho, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/454,005

(22) Filed: Dec. 3, 1999

(51) Int. Cl.$^7$ ................................................. H01L 21/44

(52) U.S. Cl. .................. 438/634; 438/584; 438/622; 438/631; 438/637; 438/639; 438/640; 438/648

(58) Field of Search .................................... 438/584, 622, 438/631, 634, 637, 639, 640, 648

(56) References Cited

U.S. PATENT DOCUMENTS 6,110,826 * 8/2000 Lou et al. ............................ 438/674

\* cited by examiner

Primary Examiner—Charles Bowers
Assistant Examiner—Lisa Kilday
(74) Attorney, Agent, or Firm—Jiawei Huang; J. C. Patents

(57) ABSTRACT

A method of forming a dual damascene structure. A first dielectric layer is formed over a substrate, and then the first dielectric layer is planarized. The first dielectric layer is etched to form a dual damascene opening that includes a via opening and a trench. The via opening exposes a conductive layer in the substrate. A metallic is formed in the via openings and the trenches so that a metallic interconnect and a via are formed at the same time. A cap layer is formed on the metallic layer. An additional etching stop layer may form on the cap layer and the substrate. A second dielectric layer is formed over the substrate. The second dielectric layer is etched to form a via opening that exposes a portion of the cap layer.

16 Claims, 5 Drawing Sheets

METHOD FOR FORMING DUAL DAMASCENE STRUCTURE

BACKGROUND OF THE INVENTION

1. Field of the Invention

The present invention relates to a method of forming multi-level interconnects for connecting a plurality of semiconductor devices. More particularly, the present invention relates to a method of forming a dual damascene structure.

2. Description of the Related Art

As the level of circuit integration increased, dimensions of each semiconductor device are reduced and the number of metallic interconnects needed for linking up devices increases correspondingly. However, as size of devices is reduced and the number of interconnects is increased, high product yield and reliability of metallic interconnects is difficult to achieve. Consequently, the semiconductor industry is now striving towards the production of interconnects with good conductivity and operating characteristics despite having a smaller contact area.

In the backend process for fabricating semiconductor devices, line width of metallic lines is also reduced. Therefore, current density sustainable by the metallic lines must be increased correspondingly. High-density current flowing along a conventional aluminum wire often results in electromigration. Electromigration can cause serious reliability problems in the semiconductor device.

To avoid electromigration in deep submicron devices, metallic material less vulnerable to electromigration such as copper has been used. Due to the low resistivity, low electromigration and easy deposition of copper, copper is now widely used for fabricating multi-level interconnects.

Since copper is resistant to most gaseous etchants, copper interconnects are not manufactured by conventional means. In general, the copper interconnects are formed by a dual damascene process. The dual damascene process includes the step of etching out a via opening for enclosing the metallic interconnect in a dielectric layer, and then filling the via opening with metal. This process is capable of producing high-quality copper interconnects with a relatively high yield.

FIGS. 1A through 1C are schematic, cross-sectional views showing the steps for producing a conventional dual damascene structure. As shown in FIG. 1A, a substrate 100 having a conductive layer 102 therein is provided. A dielectric layer 104 is formed on the substrate 100 and the conductive layer 102. Photolithographic and etching processes are conducted to form a via opening 105a and a trench 105b in the dielectric layer 104 to expose a portion of the conductive layer 102. A conformal barrier layer 106 is formed over the substrate 100, and then a copper layer 108 that fills the via opening 105a and the trench 105b is formed over the dielectric layer 104. A planarization step is performed to remove the barrier layer 106 and the copper layer 108 above the dielectric layer 104. The planarization step can be, for example, chemical-mechanical polishing.

Copper atoms can diffuse rapidly in silicon oxide and can easily react with silicon to produce copper-silicon alloy. Since the copper-silicon alloy can result in device malfunction or unwanted bridging between neighboring metallic interconnects, the barrier layer 106 is needed to prevent the diffusion of copper atoms from the copper layer 108 to the dielectric layer 104.

As shown in FIG. 1B, a silicon nitride layer 110 and an inter-metal dielectric (IMD) layer 112 are sequentially formed over the dielectric layer 104 and the copper layer 108. Since silicon nitride is a compact material, the silicon nitride layer 110 is also capable of preventing the diffusion of copper atoms into the IMD layer 112.

As shown in FIG. 1C, a patterned photoresist layer (not shown) is formed over the IMD layer 112. Using the silicon nitride layer 110 as an etching stop layer, the IMD layer 112 is etched to form a via opening 114 that exposes a portion of the silicon nitride layer 110. Due to the presence of the silicon nitride layer 110 between the dielectric layer 104 and the IMD layer 112, over-etching of the IMD layer 112 into the dielectric layer 104 can be prevented. A second etching step is carried out to remove the silicon nitride layer 110 at the bottom of the via opening 114 so that a portion of the copper layer 108 is exposed.

The via opening 114 is typically formed by reactive ion etching. However, during the etching step, energetic particles in the plasma may also bombard the copper layer 108. Consequently, some copper ions 116 are sputtered out and later deposited back onto the sidewalls of the via opening 114 or the reacting station, leading to copper contamination.

In addition, oxygen plasma is also used to remove any residual photoresist material after the via opening 114 is formed. Since oxygen may react with copper in the copper layer 108 to produce copper oxide, a layer of loose copper oxide, which can have a thickness of about 1600 angstroms, forms over the exposed portion of the copper layer 108. When a barrier layer is subsequently formed over the copper layer, conductivity of metallic interconnect may drop and via resistance may increase.

In general, a cleaning step is also conducted after the via opening 114 is formed so that polymers deposited on the sidewalls of the opening 114 can be removed. However, most organic cleaning agents contain water, which that may lead to copper corrosion and oxidation. Moreover, the polymer on the sidewalls of via opening is removed by immersing the wafer in a chemical bath filled with cleaning solution. The amount of copper ions in the cleaning solution is hard to control. Therefore, under some circumstances, the copper ions in the cleaning solution may be re-deposited back onto the wafer, causing unwanted contamination.

SUMMARY OF THE INVENTION

The invention provides a method of forming a dual damascene structure. A first dielectric layer is formed over a substrate, and then the first dielectric layer is planarized. The first dielectric layer is etched to form a via opening and a trench according to a desired metallic interconnect pattern. Copper is deposited into the via opening and the trench so that metallic interconnect and via are formed at the same time. Chemical-mechanical polishing is conducted to planarize the copper layer. To prevent the diffusion of copper atoms into the first dielectric layer and to provide a better adhesion of the copper layer, a highly stable conformal barrier layer is formed to line the interior surfaces of the trench and the via opening before copper is deposited. A cap layer is formed on the planarized copper layer. An additional etching stop layer maybe formed over the cap layer and the substrate. A second dielectric layer is formed over the substrate. The second dielectric layer is etched to form a via opening that exposes a portion of the cap layer.

According to the embodiment of this invention, the copper layer is protected by the cap layer when the via opening is formed by reactive ion etching. Hence, energetic plasma particles are blocked out, thereby avoiding the contamination of the substrate and reaction station due to the stray copper ions. Furthermore, by forming a cap layer over the exposed copper layer, oxidation through contact with oxygen in the surrounding atmosphere to form copper oxide can be prevented. Moreover, the presence of a cap layer prevents the oxidation and corrosion of copper when a wafer is cleaned by immersion in a cleaning solution.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
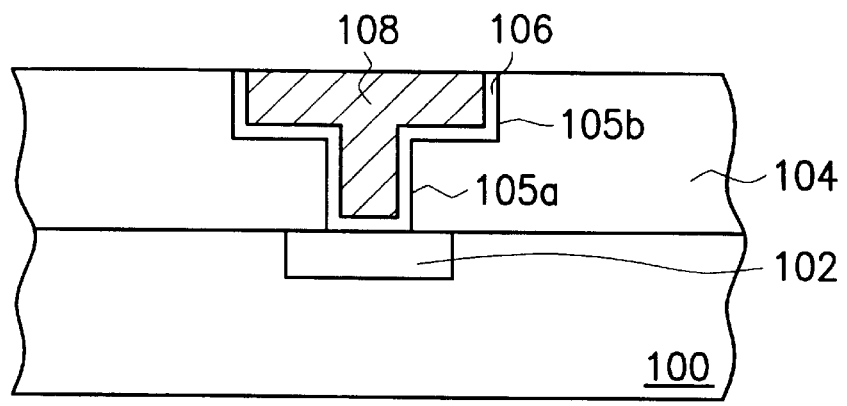
FIGS. 1A through 1C are schematic, cross-sectional views showing the steps for producing a conventional dual damascene structure.
Figure 1B:
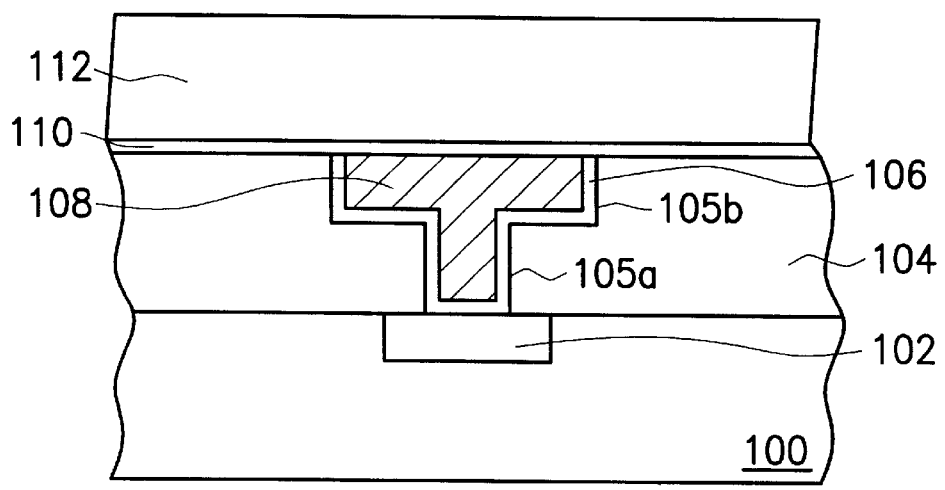
Figure 1C:
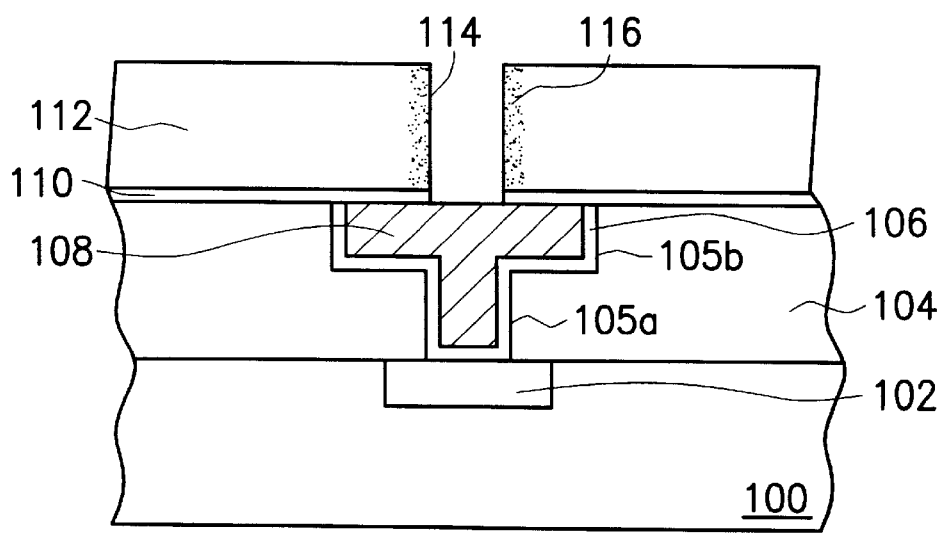

Reference will now be made in detail to the present preferred embodiments of the invention, examples of which are illustrated in the accompanying drawings. Wherever possible, the same reference numbers are used in the drawings and the description to refer to the same or like parts.

Figure 2A:
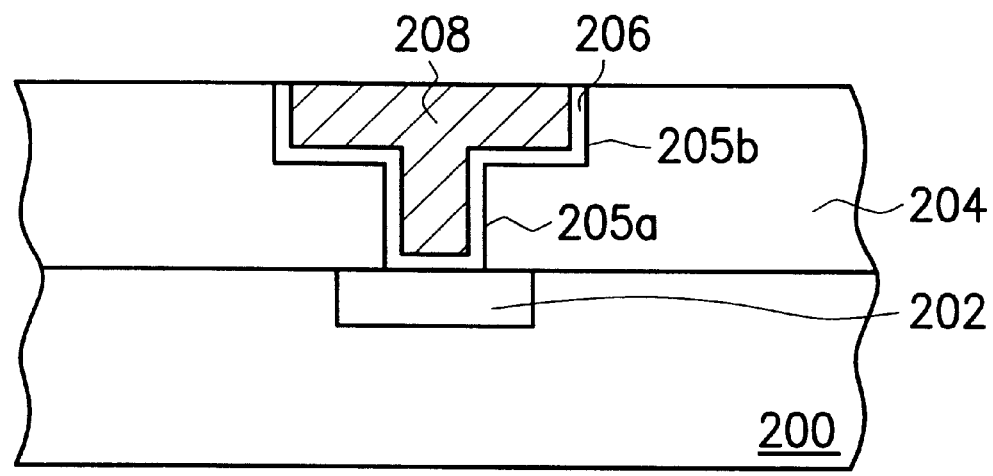
FIGS. 2A through 2D are schematic, cross-sectional views showing the steps for forming a dual damascene structure according to a first preferred embodiment of the invention.

FIGS. 2A through 2D are schematic, cross-sectional views showing the steps for forming a dual damascene structure according to a first preferred embodiment of the invention. As shown in FIG. 2A, a substrate 200 having a conductive layer 202 therein is provided. A dielectric layer 204, such as an oxide layer, is formed on the conductive layer 202. The dielectric layer 204 is planarized. The dielectric layer 204 preferably has a thickness that depends on the requirements in subsequent processing steps. A dual damascene opening that includes a via opening 205a and a trench 205b is formed in the dielectric layer 204. The dual damascene opening can be formed by the following exemplary steps. A first patterned photoresist layer (not shown) is formed to expose a desired via region above the conductive layer 202. The dielectric layer 204 is etched using the first patterned photoresist layer as a mask. The via opening 205a that exposes a portion of the conductive layer 202 is formed. The first patterned photoresist layer is removed. A second patterned photoresist layer (not shown) is formed over the dielectric layer 204. Using the second patterned photoresist layer as a mask, the dielectric layer 204 is etched to form the trench 205b. The second patterned photoresist layer is removed.

A conformal barrier layer 206 is formed over the dielectric layer 204 and the interior surfaces of the opening 205a and the trench 205b. A metallic layer 208 is formed over the substrate 200 to fill the trench 205b and the via opening 205a. Using the dielectric layer 204 as a polishing stop layer, the metallic layer 208 is planarized to form a dual damascene structure. In the first embodiment of this invention, the metallic layer 208 can be, for example, a copper layer. The metallic layer 208 can be formed by, for example, chemical vapor deposition or copperless electroplating. The barrier layer 206 is formed, for example, from a material capable of preventing the diffusion of copper atoms from the copper layer 208 to the dielectric layer 204. Preferably, the barrier layer 206 is a tantalum nitride layer formed by, for example, chemical vapor deposition. Since tantalum nitride has a high anti-diffusion capability, the diffusion of copper atoms to the dielectric layer 204 is prevented.

Figure 2B:
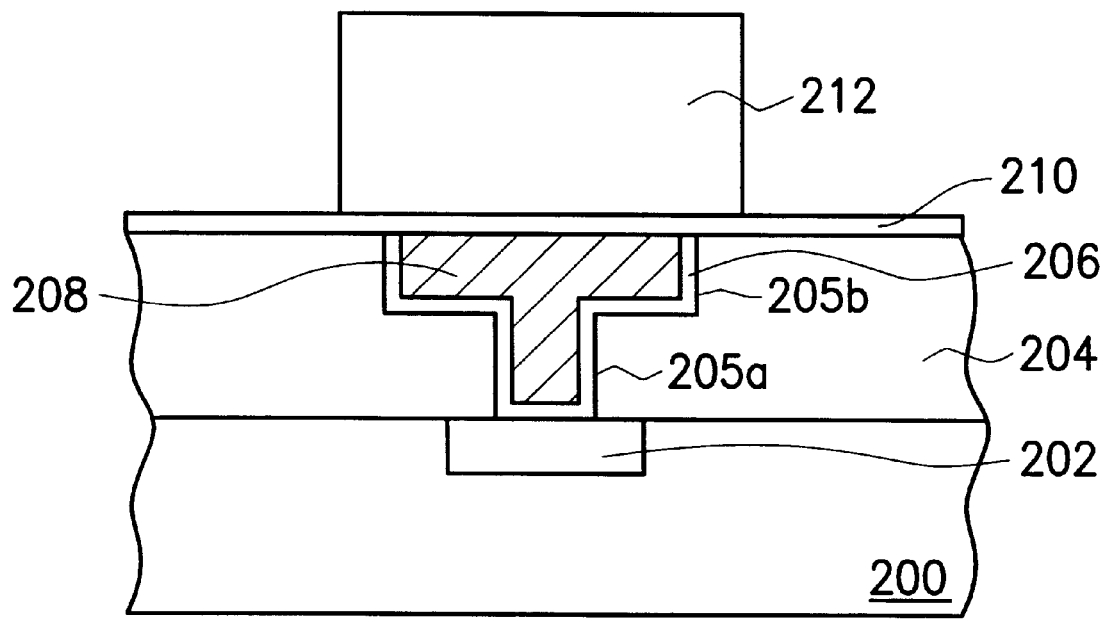

As shown in FIG. 2B, a cap layer 210 is formed on the dielectric layer 204 and the copper layer 208. The cap layer 210 can be formed from a material that can prevent the oxidation of the metallic layer 208 or the diffusion of copper atoms into a subsequently formed dielectric layer. In this embodiment, the cap layer 210 can be, for example, a titanium nitride layer, a titanium layer, a titanium tungsten (TiW) alloy layer and a tantalum nitride layer. The cap layer 210 preferably has a thickness at least capable of preventing the diffusion of copper atoms to a nearby dielectric layer. A patterned photoresist layer 212 is formed over the cap layer 210. The patterned photoresist layer 212 is formed directly above the dual damascene structure.

Figure 2C:
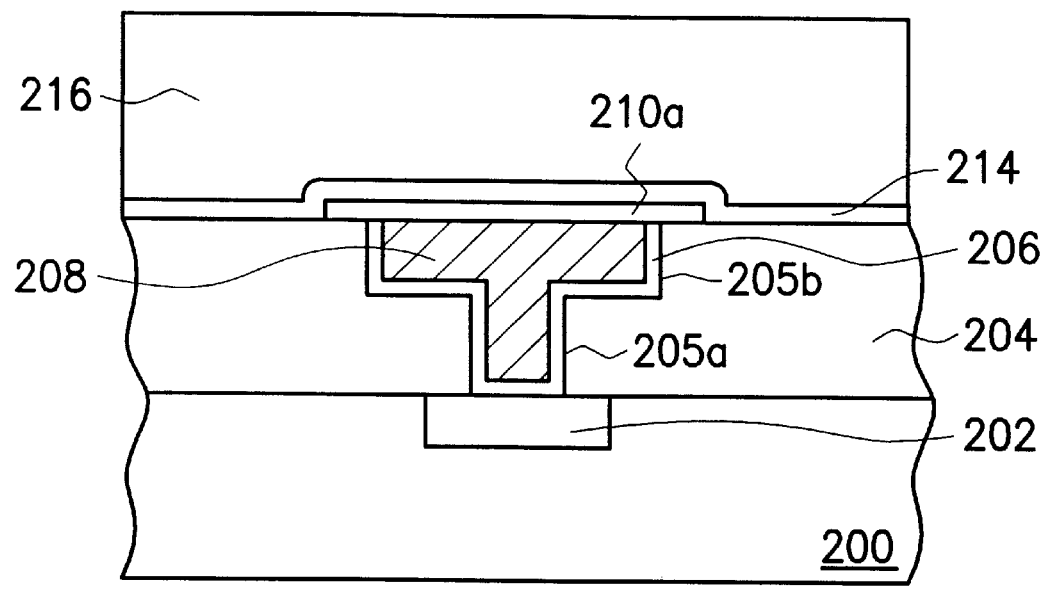

As shown in FIG. 2C, using the photoresist layer 212 as an etching mask, a portion of the cap layer 210 is removed to form a cap layer 210a to cover the metallic layer 208 of the dual damascene structure. Beside protecting the copper layer 208, the cap layer 210a can also serve as an anti-reflection coating (ARC) to prevent unwanted reflection from the surface of the metallic layer 208 when photo-exposure is subsequently carried out.

If the metallic layer 208 is a copper layer while the cap layer 210 is a titanium nitride layer, an additional conformal etching stop layer 214 needs to be formed over the cap layer 210a and the dielectric layer 204. An inter-metal dielectric (IMD) layer 216 is formed over the etching stop layer 214. The etching stop layer 214 and the inter-metal dielectric layer 216 are formed from materials having different etching rates. The etching stop layer 214 is preferably a silicon nitride layer formed by chemical vapor deposition. On the other hand, the inter-metal dielectric layer 216 preferably is a layer formed from a low dielectric constant material such as silicon oxide, fluorine doped silicon oxide or phosphosilicate glass.

Since the silicon nitride layer 214 is a compact material, diffusion of copper atoms to the inter-metal dielectric layer 216 is further suppressed. Hence, reliability of the device can be maintained.

Figure 2D:
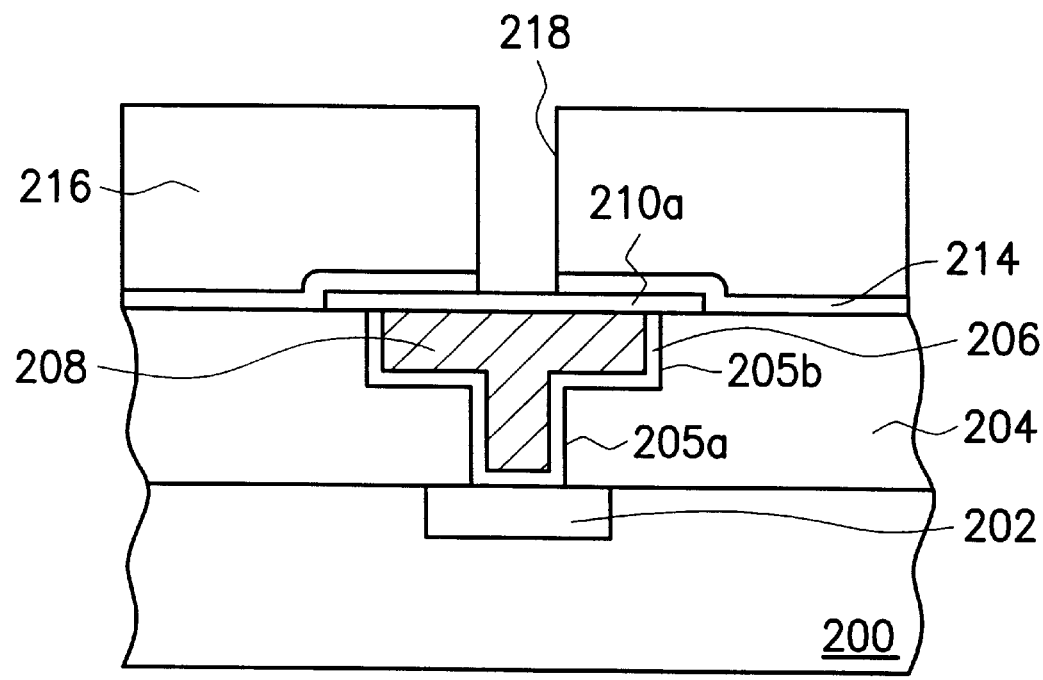

As shown in FIG. 2D, a portion of the inter-metal dielectric layer 216 is removed to expose a portion of the etching stop layer 214. The inter-metal dielectric layer 216 is removed by carrying out conventional photolithographic and etching processes. Due to protection by the etching stop layer 214, over-etching of the dielectric layer 204 is prevented.

A portion of the etching stop layer 214 is removed by etching to form a via opening 218 that exposes a portion of the cap layer 210a. The etching stop layer 214 is preferably removed by dry etching such as reactive ion etching. Oxygen plasma is applied to remove any residual photoresist material. Because the metallic layer 208 has no exposed surface, the copper layer 208 will not be oxidized into loose copper oxide during plasma etching. Therefore, electrical conductivity of metallic interconnects and via resistance can be maintained. After the formation of the via opening 218, a cleaning step is carried out to remove polymer material that attaches to the sidewalls of the via opening 218.

The present invention forms the cap layer 210a on the copper layer 208. When the inter-metal dielectric layer 216 is etched to form the via opening 218, etching plasma will stop at the cap layer 210a. Since the copper layer 208 is not exposed to the etching plasma, no copper ions are sputtered out to contaminate the wafer or the reacting station. In addition, since the copper layer 208 is completely sealed off, oxidation by oxygen plasma or corrosion and oxidation by cleaning solution is also prevented. Moreover, the steps for forming the via opening 218 are highly compatible with current fabrication techniques facilities, and hence the invention can be easily implemented.

Furthermore, according to current data, devices employing the stop on anti-reflection coating method are more stable. Since copper atoms are less vulnerable to electromigration into the inter-metal dielectric layer 216, device reliability improves.

Figure 3A:
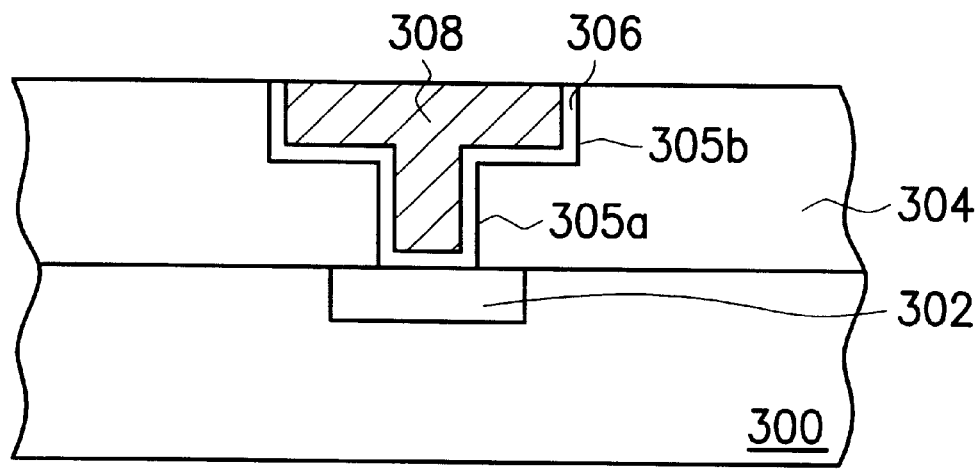
FIGS. 3A through 3D are schematic, cross-sectional views showing the steps for forming a dual damascene structure according to a second preferred embodiment of the invention.

FIGS. 3A through 3D are schematic, cross-sectional views showing the steps for forming a dual damascene structure according to a second preferred embodiment of the invention. As shown in FIG. 3A, a substrate 300 having a conductive layer 302 therein is provided. A dielectric layer 304, such as an oxide layer is formed, over the substrate 300. The dielectric layer 304 is planarized. The dielectric layer 304 has a thickness that depends on the requirements in subsequent processing steps. A dual damascene opening that includes a via opening 305a and a trench 305b is formed in the dielectric layer 304. The dual damascene opening can be formed by the following exemplary steps. A first patterned photoresist layer (not shown) that exposes a desired via region above the conductive layer 302 is formed. The dielectric layer 304 is etched to form the via opening 305a that exposes a portion of the conductive layer 302. The first patterned photoresist layer is removed. A second patterned photoresist layer (not shown) is formed over the dielectric layer 304. Using the second patterned photoresist layer as a mask, the dielectric layer 304 is etched to form the trench 305b. The second patterned photoresist layer is removed.

A conformal barrier layer 306 is formed over the dielectric layer 304 and the interior surfaces of the opening 305a and the trench 305b. Metallic material is deposited over the dielectric layer 304 and into the trench 305b and the via opening 305a to form a metallic layer 308. Using the dielectric layer 304 as a polishing stop layer, the metallic layer 308 is planarized to form a dual damascene structure. In the second embodiment of this invention, the metallic layer 308 can be a copper layer formed by, for example, chemical vapor deposition or copperless electroplating. The barrier layer 306 is formed from, for example, a material capable of preventing the diffusion of copper atoms from the copper layer 308 to the dielectric layer 304. Preferably, the barrier layer 306 is a tantalum nitride layer formed by, for example, chemical vapor deposition. Since tantalum nitride has a high anti-diffusion capability, the diffusion of copper atoms to the dielectric layer 304 is prevented.

Figure 3B:
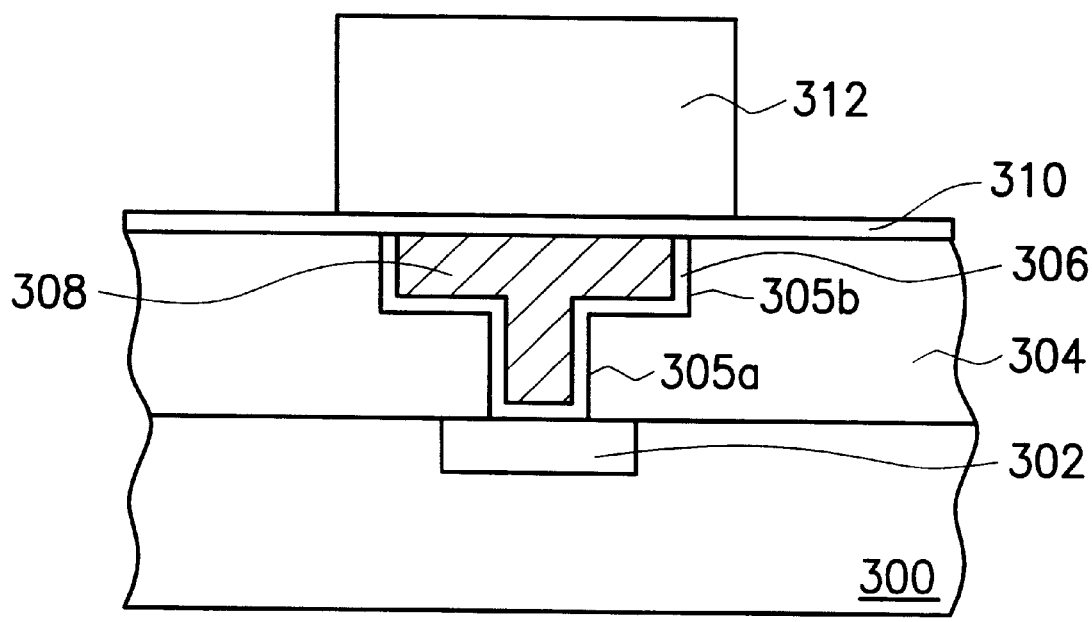

As shown in FIG. 3B, a cap layer 310 is formed on the dielectric layer 304 and the copper layer 308. The cap layer 310 can be formed from a material that prevents the oxidation of the metallic layer 308 or the diffusion of copper atoms into a subsequently formed dielectric layer. In this embodiment, the cap layer 310 can be, for example, a titanium nitride layer, a titanium layer, a titanium tungsten (TiW) alloy layer or a tantalum nitride layer. The cap layer 310 preferably has a thickness at least capable of preventing the diffusion of copper atoms to a nearby dielectric layer. A patterned photoresist layer 312 is formed over the cap layer 310. The patterned photoresist layer 312 is formed directly above the dual damascene structure.

Figure 3C:
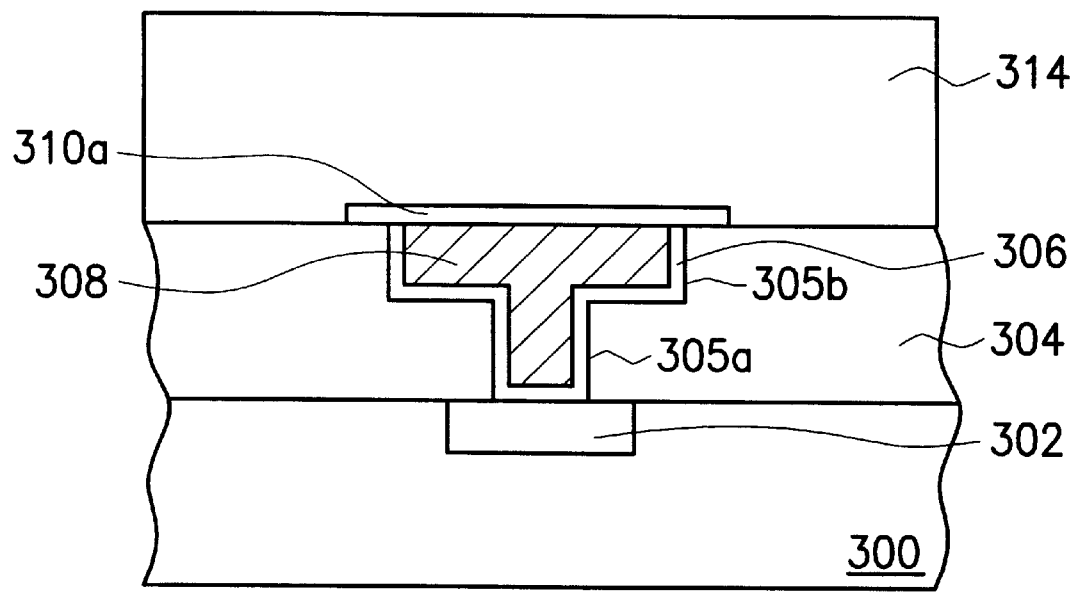

As shown in FIG. 3C, using the photoresist layer 312 as an etching mask, a portion of the cap layer 310 is removed to form a cap layer 310a to cover the metallic layer 308 of the dual damascene structure. Beside protecting the copper layer 308, the cap layer 310a can also serve as an anti-reflection coating (ARC) to prevent unwanted reflection from the surface of the metallic layer 308 when photo-exposure is subsequently carried out.

In the second embodiment of this invention, the metallic layer 308 is a copper layer while the cap layer 310 is tantalum nitride. Since tantalum nitride has a higher anti-diffusion capacity for copper atoms than titanium nitride, a silicon nitride layer need not form over the tantalum nitride layer as in the first embodiment.

An inter-metal dielectric (IMD) layer 314 is formed over the cap layer 310a and the dielectric layer 304. The inter-metal dielectric layer 314 can be formed from a low dielectric constant material such as silicon oxide, fluorine doped silicon oxide or phosphosilicate glass.

Figure 3D:
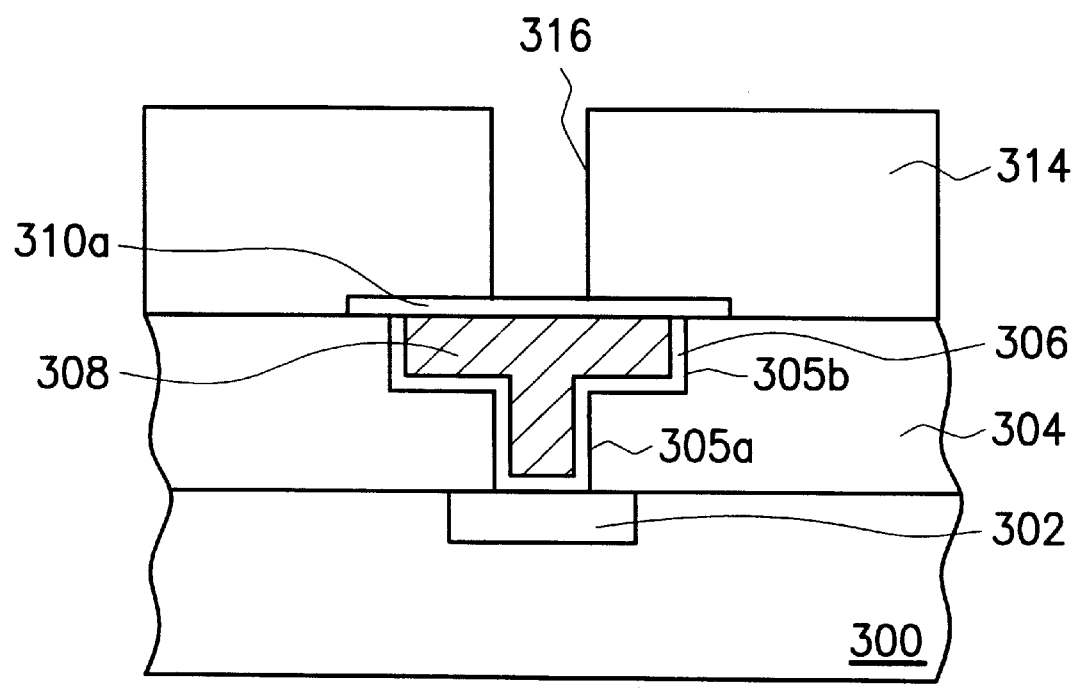

As shown in FIG. 3D, a portion of the inter-metal dielectric layer 314 is removed to form a via opening 316 that exposes a portion of the cap layer 310a. The inter-metal dielectric layer 314 is removed by carrying out conventional photolithographic and etching processes. Preferably, the via opening 316 is formed by, for example, dry etching such as reactive ion etching.

Oxygen plasma is next applied to remove any residual photoresist material. Because the metallic layer 308 has no exposed surface, the copper layer 208 will not be oxidized into loose copper oxide during plasma etching. Therefore, electrical conductivity of metallic interconnects and resistance of via can be maintained. After the formation of the via opening 316, a cleaning step is carried out to remove polymer material that attaches to sidewalls of the via opening 316.

One major aspect of this invention is the formation of a cap layer 310a over the copper layer 308. When the inter-metal dielectric layer 314 is etched to form the via opening 316, etching plasma will stop at the cap layer 310a instead of the copper layer 308. Since the copper layer 308 is not exposed to etching plasma, no copper ions are sputtered out to contaminate the wafer or the reacting station. In addition, since the copper layer 308 is completely sealed off, oxidation by oxygen plasma or corrosion and oxidation by cleaning solution is also prevented. Moreover, the steps for forming the via opening 316 are highly compatible with current fabrication techniques facilities, and hence the invention can be easily implemented.

In brief, according to current data, devices employing stop on anti-reflection coating method are more stable. Since copper atoms are less capable of migrating into the inter-metal dielectric layer 314 through the inter-metal dielectric layer 314, device reliability improves.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure comprising:
   - forming a conductive layer in a substrate;
   - forming a first dielectric layer over the substrate;
   - forming a dual damascene opening in the first dielectric layer to expose the conductive layer, wherein the dual damascene opening includes a first via opening and a trench;
   - forming a barrier layer on sidewalls of the trench and the via opening;
   - forming a metallic layer in the trench and the via opening;
   - forming a cap layer to cover the metallic layer;
   - forming an etching stop layer over the first dielectric layer and the cap layer;
   - forming a second dielectric layer over the etching stop layer; and
   - removing a portion of the second dielectric layer and the etching stop layer to form a second via opening that exposes a portion of the cap layer.

2. The method of claim 1, wherein the step of forming the barrier layer comprises depositing tantalum nitride by chemical vapor deposition.

3. The method of claim 1, wherein the step of forming the metallic layer comprises depositing copper.

4. The method of claim 1, wherein the step of forming a metallic layer into the first via opening and the trench further comprises:
   - depositing a metallic material over the first dielectric layer and into the trench and the first via opening; and
   - planarizing the metallic material to remove the metallic material above the first dielectric layer.

5. The method of claim 4, wherein the step of planarizing the metallic layer comprises chemical-mechanical polishing.

6. The method of claim 1, wherein the step of forming the cap layer comprises depositing titanium nitride.

7. A method of forming a dual damascene structure comprising:
   - forming a conductive layer in a substrate;
   - forming a first dielectric layer over the substrate;
   - forming a dual damascene opening in the first dielectric layer to expose the conductive layer, wherein the dual damascene opening includes a first via opening and a trench;
   - forming a barrier layer on sidewalls of the trench and the via opening;
   - forming a metallic layer in the trench and the via opening;
   - forming a cap layer on the metallic layer;
   - forming a second dielectric layer over the cap layer; and
   - removing a portion of the second dielectric layer to form a second via opening that exposes a portion of the cap layer.

8. The method of claim 7, wherein the barrier layer comprises a tantalum nitride layer.

9. The method of claim 7, wherein the barrier layer is formed by chemical vapor deposition.

10. The method of claim 7, wherein the metallic layer comprises a copper layer.

11. The method of claim 7, wherein the step of forming the metallic layer in the first via opening and the trench further comprises:
    - depositing a metallic material over the first dielectric layer and into the trench and the first via opening; and
    - planarizing the metallic layer to remove the metallic layer above the first dielectric layer.

12. The method of claim 11, wherein the step of planarizing the metallic layer comprises chemical-mechanical polishing.

13. The method of claim 7, wherein the cap layer comprises a tantalum nitride layer.

14. A method of forming a dual damascene structure capable of preventing copper oxidation, comprising the steps of:
    - providing a substrate;
    - forming a conductive layer over the substrate;
    - forming a first dielectric layer over the conductive layer;
    - forming a dual damascene opening in the first dielectric layer, wherein the dual damascene opening includes a first via opening and a trench;
    - forming a barrier layer on sidewalls of the trench and the via opening;
    - depositing copper into the trench and the via opening to form a copper layer; and
    - forming a cap layer over the copper layer.

15. The method of claim 14, wherein the step of forming the cap layer includes depositing tantalum nitride.

16. The method of claim 14, wherein the step of forming the cap layer includes depositing titanium nitride.

* * * * *